US009657389B2

(12) United States Patent
Krassnitzer et al.

(10) Patent No.: US 9,657,389 B2
(45) Date of Patent: May 23, 2017

(54) TARGET FOR SPARK VAPORIZATION WITH PHYSICAL LIMITING OF THE PROPAGATION OF THE SPARK

(75) Inventors: Siegfried Krassnitzer, Feldkirch (AT); Juerg Hagmann, Sax (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 82 days.

(21) Appl. No.: 13/641,499

(22) PCT Filed: Jan. 10, 2011

(86) PCT No.: PCT/EP2011/000057
§ 371 (c)(1),
(2), (4) Date: Dec. 5, 2012

(87) PCT Pub. No.: WO2011/128004
PCT Pub. Date: Oct. 20, 2011

(65) Prior Publication Data
US 2013/0126348 A1    May 23, 2013

Related U.S. Application Data

(60) Provisional application No. 61/324,929, filed on Apr. 16, 2010.

(30) Foreign Application Priority Data

May 17, 2010    (DE) .................... 10 2010 020 737 U

(51) Int. Cl.
C23C 14/00    (2006.01)
C23C 14/32    (2006.01)
(Continued)

(52) U.S. Cl.
CPC .......... *C23C 14/325* (2013.01); *H01J 37/305* (2013.01); *H01J 37/32614* (2013.01)

(58) Field of Classification Search
CPC ......................... H01J 37/3411; H01J 37/3438
See application file for complete search history.

(56) References Cited

U.S. PATENT DOCUMENTS 5,298,136 A    3/1994  Ramalingam
6,338,781 B1*  1/2002  Sichmann et al. ....... 204/298.12
(Continued)

FOREIGN PATENT DOCUMENTS

DE    4401986 A1    7/1995
JP    62-218562 A    9/1987
WO    00/16373 A1    3/2000

OTHER PUBLICATIONS

International Search Report for PCT/EP2011/000057 dated Apr. 5, 2011.

*Primary Examiner* — Keith Hendricks
*Assistant Examiner* — Timon Wanga
(74) *Attorney, Agent, or Firm* — Pearne & Gordon LLP

(57) ABSTRACT

The present invention relates to a target for an ARC source having a first body (3) of a material to be vaporized, which essentially comprises in one plane a surface which is intended to be vaporized, wherein the surface surrounds in this plane a central area, characterized in that in the central area a second body (7) is provided, which is preferably in the form of a disk and is electrically isolated from the first body (3), in such a way that the second body (7) can essentially provide no electrons for maintaining a spark.

18 Claims, 2 Drawing Sheets

(51) Int. Cl.
*H01J 37/305* (2006.01)
*H01J 37/32* (2006.01)

(56) References Cited

U.S. PATENT DOCUMENTS

| | | | |
|---|---|---|---|
| 2003/0047443 A1* | 3/2003 | Clarke | 204/192.12 |
| 2005/0150759 A1* | 7/2005 | Chang | 204/192.38 |
| 2006/0049041 A1* | 3/2006 | Ockenfuss | H01J 37/3438 |
| | | | 204/298.14 |

* cited by examiner

TARGET FOR SPARK VAPORIZATION WITH PHYSICAL LIMITING OF THE PROPAGATION OF THE SPARK

The present invention relates to a target for a spark vaporization source according to the preamble of the claims, as well as a corresponding spark vaporization source and a method for producing layers by means of spark vaporization.

Hereinafter spark vaporization is understood to mean a physical coating method by means of vacuum vaporization where a cathode spot vaporizes material from a surface provided for this. The device in which the material to be vaporized is provided is hereinafter called target. Together with an ignition device to ignite the spark as well as a voltage source to sustain the spark, the target forms an arc source. Limiting the propagation of the cathode spot is hereinafter called arc confinement.

Arc sources are mainly operated by means of a superimposed magnetic field. In this case, magnetic means are provided on the target that lead to a distribution of magnetic field lines (hereinafter simply called magnetic field) inter alfa above, i.e. at least near the surface of the target material to be vaporized outside of the target, which influence the rate of migration of the cathode spot on the target surface as well as the conditions for discharge such as for example the discharge voltage.

One problem occurring with the generation of the magnetic field is the fact that an axially symmetric field that in the center differs from zero always has field lines in the center exit out of the target perpendicularly to the surface. This is shown schematically in FIG. 1 for a round target and in FIG. 2 for a rectangular target. In the areas where the field lines are essentially perpendicular to the surface of the target, the rate of migration of the cathode spot is greatly reduced. This effect may be called the collapse of the cathode spot in the center. There is a greater removal of material with an increase in the formation of droplets, both in numbers as well as in mass, in this area. Droplets are essentially liquid, i.e. non-vaporized, conglomerates of target material, that are ejected from the surface of the target material and which are deposited as macro particles onto the substrate to be coated. In reactive coating processes, this will often result in the conglomerates not having been able to completely react with the reactive gas.

Two countermeasures against this collapse of the cathode spot in the center are generally known.

On the one hand, it is possible to try and avoid the collapse by a clever choice of the magnet system, This can be achieved for example with divergent magnet field lines. It is however known that by focusing the magnet fields, the vaporized material can be directed increasingly to the substrate to be coated, which leads to an increase in the efficiency of the use of the material. Choosing divergent magnetic field lines means forgoing this advantage.

On the other hand, it is known to take measures that ban the cathode spot from the center of the target, despite the magnetic field lines exiting perpendicularly, i.e. that limit it to areas of the target outside the central area. Thus, according to WO 0016373, the problem of the collapse of the cathode spot in the central area is mitigated by providing a shutter in the central area of the target, whose material has a lower yield of secondary electrons. Boron nitride, for example, is used there as material for the shutter. With this approach, however, the problem arises of the coating rendering the surface of the shutter electrically conductive, thus allowing the cathode spot to migrate onto the surface of the shutter and hence resulting in unwanted components in the coating that is to be formed.

The aim of the present invention is to overcome at least partially the disadvantages of the state of the art. The measures taken should still ensure the suitability of job coating operations in the production environment. Consequently, there are requirements for low coast, process stability, and ease of maintenance.

According to the invention, the aim is achieved according to the characterizing part of the claims. The dependent claims contain further advantageous embodiments.

The inventors have realized that one problem in WO 0016373 consists in the fact that, due to the contact between the shutter and the material to be vaporized, as the coating progresses an electrically conductive connection is established that allows spark discharge onto the surface of the shutter in spite of a lower yield of secondary electrons.

According to the invention, the cathode spot is banned very of from the central area of the target surface by permanently cutting off the electron supply during the coating process, i.e. the spark discharge is excluded due to lack of current-carrying capacity. This can be achieved for example by permanently isolating the central part and arranging it on an electrically floating potential. Surprisingly enough, once this supply of electrons in the central area has been sustainably prevented, event material identical to the rest of the surface of the target can be used as shutter material. Using materials that exhibit a lower yield of secondary electrons is therefore no longer a prerequisite. Should the cathode spot happen to drift temporarily onto the shutter, this would not, in this case, lead to a contamination of the layers.

The invention will now be described in more detail on the basis of examples and figures, in which:

Figure 1:
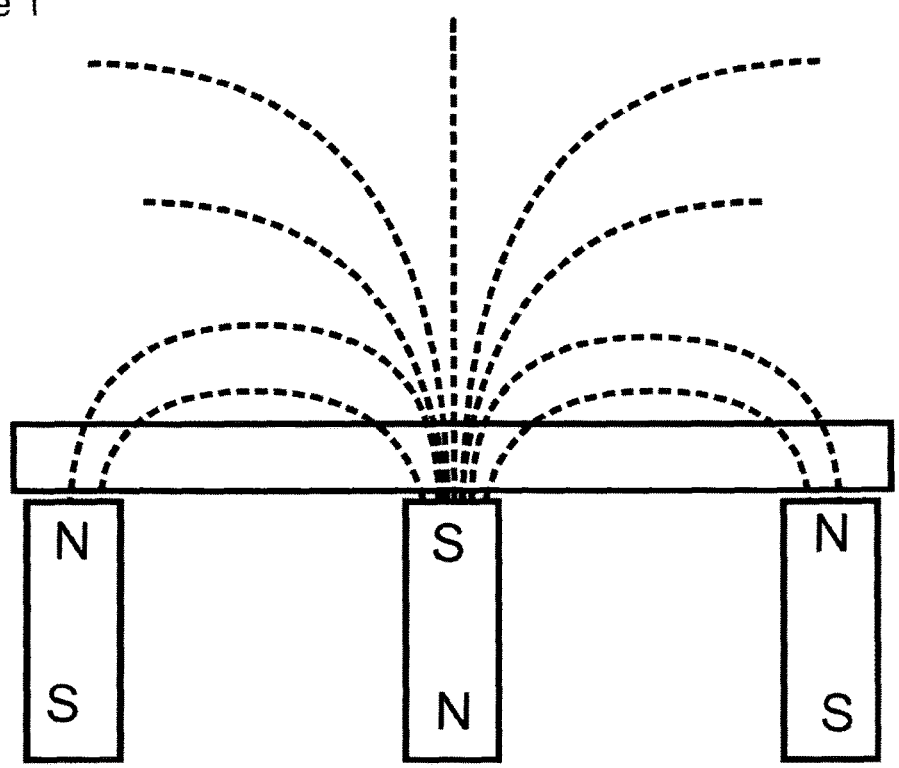
FIG. 1 shows a schematic diagram of field lines of an axially symmetric magnetic field for a round target.
Figure 2:
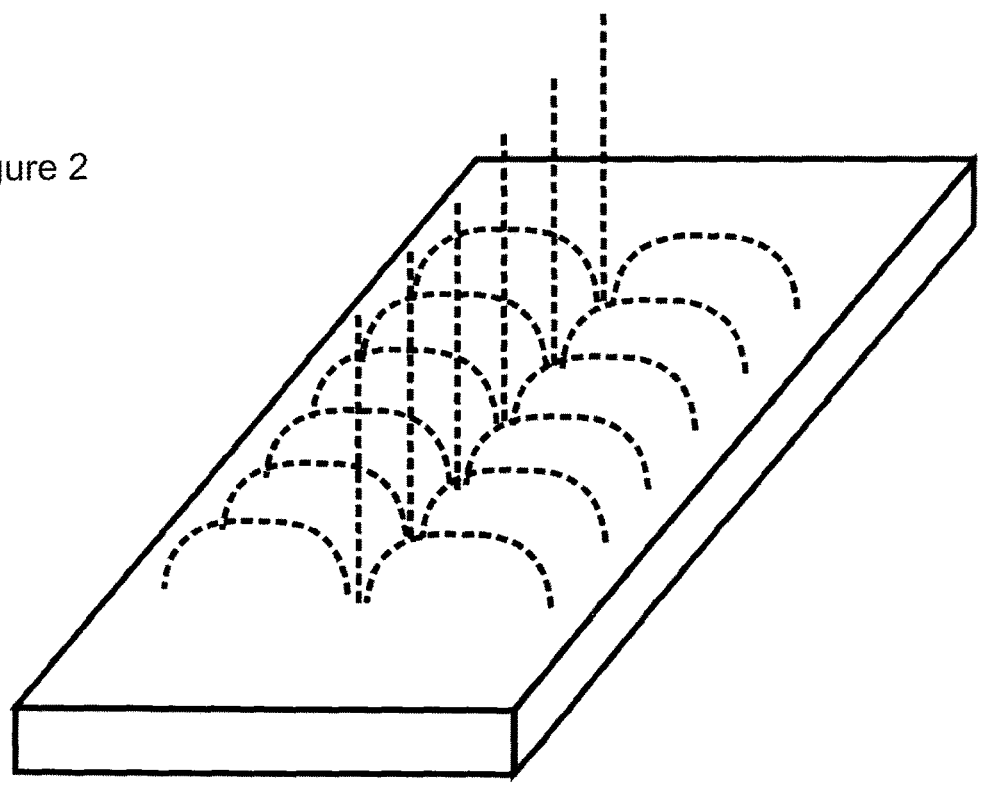
FIG. 2 shows a schematic diagram of field lines of an axially symmetric magnetic field for a rectangular target.
Figure 3:
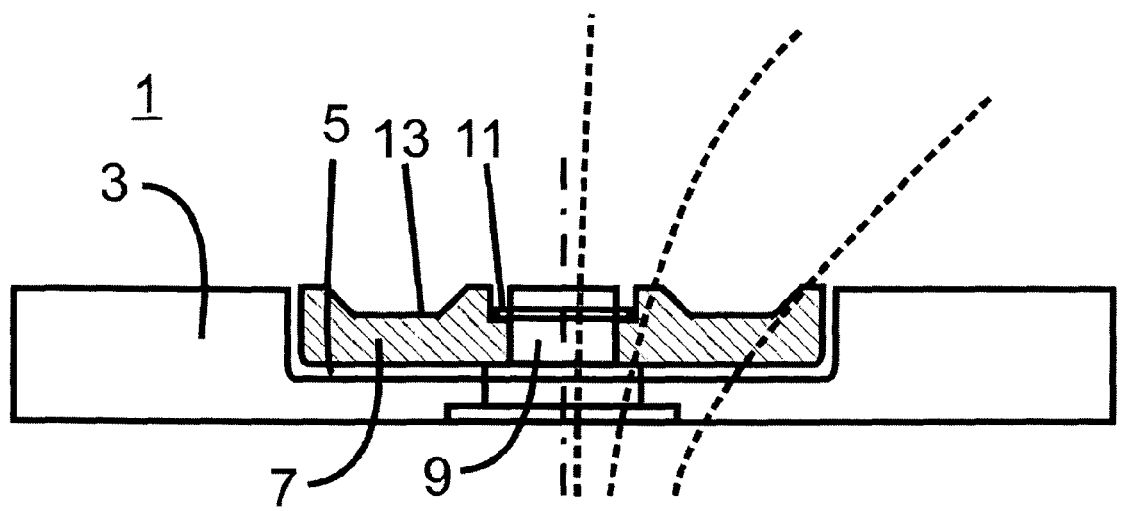
FIG. 3 shows an inventive embodiment of a target with a disk in a non-magnetic embodiment and, schematically, the field line path.

According to a first embodiment, the target 1 as shown in FIG. 3 comprises a target material 3, in the example titanium, with a recess 5 in the central area to receive a disk 7, fitted in an electronically isolated manner, and which is held to an isolator pin 9 by means of a circlip 11. Ceramic electrically non-conductive material for example is suitable as isolator pin 9. The distances between the target material 3 and the disk 7 are between approx. 1.5 mm and 3.5 mm. if the distance is any larger, there is a risk of the cathode spot running under the disk 7 lying on the floating potential. With a distance of less than 1.5 mm, there is a risk that the accumulation of coating material will lead to an electrical contact between the target material 3 and the disk 7.

In order to produce the target, a plate of target material is preferably first superimposed onto a carder plate (not shown), which serves both for cooling as well as for providing an electrical contact. Only then will the mechanical locking of the isolator pin 9, of the disk 7 and of the circlip 11 be carded out.

In many applications, the target 1 is placed on the side-walls of the coating chamber. This means for a round target that the axis of symmetry of the target 1 lies in the horizontal plane. In the example, the disk 7 comprises a hole with which it is pushed onto the isolator pin 9. The diameter of the hole is preferably selected to be at least some tenth of a millimeter larger than the diameter of the part of the isolator pin 9 that is pushed through the hole. Because of gravity, the disk 7 thus rests on a line on the upper jacket of the isolator pin 9. The circlip 11, as shown in FIG. 3, is lowered into a central recess of the disk 7. The load-bearing line is therefore further reduced and, in the worst case, the disk's center of gravity lies in such a way that the disk 7, due to the tolerance, is mounted in a tilted manner on the jacket of the isolator pin 9. In order to avoid this, according to an inventive further development, the disk 7 comprises one or several recesses 13. These recesses 13 cause the center of gravity of the disk 7 to be displaced on the axis away from the circlip 11, and therefore prevent the disk 7 from being mounted in a tilted manner.

Figure 4:
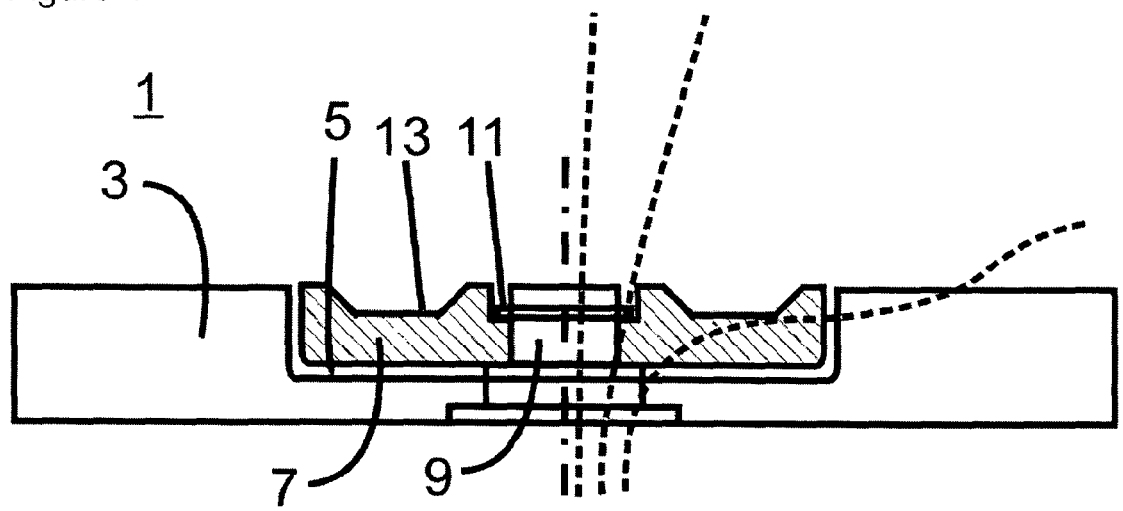
FIG. 4 shows an inventive embodiment of a target with a disk in a magnetic embodiment with magnetically soft material and, schematically, the field line path.

According to the present embodiment, the disk 7 consists of electrically conductive, for example metallic material. According to a particularly preferred embodiment, the floating disk 7 can also be executed of a magnetically soft material, which makes it possible to achieve that the field lines at the outer edge of the disk exit perpendicularly and are essentially parallel to the surface of the target, as shown in FIG. 4 by means of dotted lines on the right-hand side. This guarantees a fast migration rate of the cathode spot over the whole of the remaining area of the target.

In the present description, a target for an arc source was disclosed with a first body 3 made of a material to be vaporized, comprising essentially in one plane a surface designed to be vaporized, wherein the surface in this plane surrounds a the central area, characterized in that in the central area a second body 7 is provided, which is preferably in the form of a disk and is electrically isolated from the first body 3, in such a way that the second body 7 can essentially provide no electrons for maintaining a spark.

The first body 3 preferably comprises a recess 5 in the central area into which the second body 7 can be lowered and fastened by means of an isolator pin 9, wherein the distance between the first body 3 and the second body 9 is one or several values between and including 1.5 mm and 3.5 mm, wherein in a particularly preferred embodiment the body 7 comprises, at least at the surface that protrudes from the recess 5, material that corresponds to the material of the body 3.

The second body 7 can comprise one or several recesses 13 in such a way that the center of gravity of the second body 7 mounted on the axis comes to rest level with the jacket of the hole.

In a further particularly preferred embodiment, the second body 7 is executed from magnetically soft material.

What is claimed is:

1. A target for an arc source having a first body (3) of a material to be vaporized, the first body (3) comprising substantially in one plane a vaporizable surface, wherein the surface surrounds in this plane a central area, characterized in that in the central area a second body (7) is provided as a shutter, that is in the form of a disk permanently electrically isolated from the first body (3) and the second body (7) is arranged on an electrically floating potential, in such a way that the second body (7) provides substantially no electrons for maintaining a spark,
wherein the shutter is positioned to mitigate collapse of a cathode spot in the central area.

2. The target according to claim 1, characterized in that the first body (3) in the central area comprises a recess (5) into which the second body (7) is lowered and fastened by means of an isolator pin (9), wherein the distance between the first body (3) and the second body (7) is one or several values between and including 1.5 mm and 3.5 mm.

3. The target according to claim 2, characterized in that the second body (7) comprises, at least at the surface that protrudes from the recess (5), material that corresponds to the material of the first body (3).

4. The target according to claim 2, characterized in that the second body (7) comprises at least one recess (13) designed in such a way that the center of gravity of the second body (7) is shifted to a point where the second body (7) comes to rest perpendicular to the isolator pin (9).

5. The target according to claim 1, characterized in that the second body is made of a magnetically soft material.

6. A target for an arc source comprising:
a first body (3) of a material to be vaporized by a cathode spot during a coating process including a vaporizable surface, wherein the surface generally defines a plane and the surface surrounds a central area substantially in the plane; and
a second body (7) disposed in the central area, wherein the second body (7) is provided as a shutter, that is in the form of a disk permanently electrically isolated from the first body (3) and the second body (7) is arranged on an electrically floating potential in such a way that the second body (7) provides substantially no electrons for maintaining a spark during the coating process,
wherein the shutter is positioned to mitigate collapse of a cathode spot in the central area.

7. A target for an arc source comprising:
a first body (3) of a material to be vaporized by a cathode spot during a coating process including a vaporizable surface, wherein the surface generally defines a plane and the surface surrounds a recessed central area substantially in the central region of the plane; and
a second body (7) disposed in the central area, wherein the second body (7) comprising an upper surface and a lower surface is provided as a shutter, that is in the form of a disk permanently electrically isolated from the first body (3) and the second body (7) being arranged on an electrically floating potential in such a way that the second body (7) provides substantially no electrons for maintaining a spark during the coating process,
wherein the shutter is positioned to mitigate collapse of a cathode spot in the central area.

8. The target according to claim 7, wherein at least a portion of the upper surface of the second body (7) is positioned lower than the plane of the first body (3).

9. The target according to claim 7, wherein at least a portion of the upper surface of the second body (7) is in the plane of the first body (3).

10. The target according to claim 7, wherein a first portion of the upper surface of the second body (7) is in the plane of the first body (3) and a second portion of the upper surface of the second body (7) is lower than the plane of the first body (3).

11. The target according to claim 7, wherein the second body (7) comprises one of one and plurality of recesses on the upper surface of the second body (7).

12. The target according to claim 2, wherein the second body (7) comprises one of one and plurality of recesses on an upper surface of the second body (7).

13. The target according to claim 1, characterized in that the second body (7) is made of a material identical to the material forming the first body (3).

14. A target for an spark source to be arc evaporated, the target having a first body (3) of a material to be vaporized, the first body (3) comprising substantially in one plane a vaporizable surface, wherein the surface surrounds in this plane a central area, characterized in that in the central area a second body (7) is provided as a shutter, that is in the form of a disk permanently electrically isolated from the first body (3) and the second body (7) is arranged on an electrically floating potential, in such a way that the second body (7) provides substantially no electrons for maintaining a spark, wherein the shutter is positioned to mitigate collapse of a cathode spot in the central area.

15. The target according to claim 1, wherein a portion of an exterior surface of the second body (7) is in contact with an atmosphere.

16. The target according to claim 2, wherein the second body (7) is coupled to the isolator pin (9) by means of a circlip (11).

17. The target according to claim 1, wherein at least a first two-dimensional surface portion of the upper surface of the second body (7) is in a co-planar relationship with the vaporizable surface of the first body (3).

18. The target according to claim 17, wherein a second two-dimensional surface portion of the upper surface of the second body (7) is lower than the vaporizable surface of the first body (3).

* * * * *